United States Patent
Boone, Jr. et al.

(10) Patent No.: US 7,466,521 B2
(45) Date of Patent: Dec. 16, 2008

(54) EMR STRUCTURE WITH BIAS CONTROL AND ENHANCED LINEARITY OF SIGNAL

(75) Inventors: Thomas Dudley Boone, Jr., San Jose, CA (US); Liesl Folks, Campbell, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 420 days.

(21) Appl. No.: 11/411,606

(22) Filed: Apr. 25, 2006

(65) Prior Publication Data

US 2007/0247763 A1  Oct. 25, 2007

(51) Int. Cl.
  *G11B 5/39*  (2006.01)
(52) U.S. Cl. ....................................... 360/313
(58) Field of Classification Search ................. 360/313, 360/324; 257/421
  See application file for complete search history.

(56) References Cited

U.S. PATENT DOCUMENTS

| | | | | |
|---|---|---|---|---|
| 4,052,748 | A | 10/1977 | Kuijk | 360/113 |
| 5,965,283 | A | 10/1999 | Solin et al. | 428/692 |
| 6,707,122 | B1* | 3/2004 | Hines et al. | 257/421 |
| 6,714,374 | B1 | 3/2004 | Hayashi et al. | 360/66 |
| 7,167,346 | B2* | 1/2007 | Carey et al. | 360/313 |
| 7,170,722 | B2* | 1/2007 | Carey et al. | 360/324 |
| 7,203,036 | B2* | 4/2007 | Chattopadhyay et al. | 360/313 |
| 7,295,406 | B2* | 11/2007 | Chattopadhyay et al. | 360/313 |
| 2003/0128478 | A1* | 7/2003 | Gill et al. | 360/313 |
| 2004/0129087 | A1 | 7/2004 | Rowe et al. | 73/777 |
| 2007/0188933 | A1* | 8/2007 | Carey | 360/313 |
| 2008/0019055 | A1* | 1/2008 | Gurney et al. | 360/313 |

FOREIGN PATENT DOCUMENTS

JP  62-3612  1/1987

(Continued)

OTHER PUBLICATIONS

S.A. Solin et al., "Room Temperature Extraordinary Magnetoresistance of Nonmagnetic Narrow-Gap Semiconductor/Metal composites: Application To Read-Head Sensors For Ultrahigh-Density Magnetic Recording" IEEE Transactopns on Magnetics, vol. 38, No. 1, p. 89-94 Jan. 2002.

(Continued)

*Primary Examiner*—Tianjie Chen
(74) *Attorney, Agent, or Firm*—Zilka-Kotab, PC

(57) ABSTRACT

An extraordinary magnetoresistive device EMR having a discontinuous shunt structure. The discontinuous shunt structure improves the linearity of response of the EMR device. The EMR device includes a EMR heterostructure that includes an EMR active layer. The heterostructure can include first, second and third semiconductor layers, with the second layer being sandwiched between the first and third layers. The middle, or second semiconductor layer provides a two dimensional electron gas. The heterostructure has first and second opposed sides, with a pair of voltage leads and a pair of current leads connected with the first side of the structure. The discontinuous shunt structure is connected with the second side of the structure and may be in the form of a series of discontinuous, electrically conductive elements, such as semi-spherical gold elements.

19 Claims, 6 Drawing Sheets

FOREIGN PATENT DOCUMENTS

| JP | 5267746 | 10/1993 |
|---|---|---|
| JP | 6203338 | 7/1994 |

OTHER PUBLICATIONS

Akinaga, Hiro, "High-Sensitive Magnetic-Field-Sensing Materials Composed of Metal/Semiconductor Hybrid Nanostructures" Proceedings of the International Conference on MEMS, NANO and Smart Systems (ICMENS '03).

S.A. Solin et al, "Enhanced Room-Temperature Geometric Magnetoresistence In Inhomogeneous Narrow-Gap Semiconductors" www.sciencemag.org, Science, vol. 289, p. 1530-1532 Sep. 1, 2000.

C.H. Möller et al., "Effect of the Interface Resistance on the Extraordinary Magnetoresistance of Semiconductor/Metal Hybrid Structures" Journal of Superconductivity: Incorporating Novel Magnetism, vol. 16, No. 1, Feb. 2003.

Holx, Matthias, "Semiconductor-Metal Hybrid Structures: Novel Perpsective for Read Heads" Sensors, 2003. Proceedings of IEEE, vol. 2, p. 1245-1248, Oct. 22-24, 2003.

Merkt, Ulrich, "Hybrid Semiconductor/Metal Nanostructures with Two-Dimensional Electron Systems" Superlattices and Microstructures 33 (2003) p. 357-367.

Romankiw, LT., "Magnetically Coupled Barberpole MR Head With Built In Longitudinal Bias Structure and Process" IBM Technical Disclosure Bulletin Jul. 1977, p. 791-793.

J. Moussa et al., "Response of an Extraordinary Magnetoresistence Read Head to a Magnetic Bit" Journal of Applied Physics, vol. 94, No. 2, p. 1110-1113, Jul. 15, 2003.

T. Zhou et al., "Extraordinary Magnetoresistance in Externally Shunted van der Pauw Plates" Applied Physics Letters, vol. 78, No. 5, p. 667-669, Jan. 29, 2001.

\* cited by examiner

EMR STRUCTURE WITH BIAS CONTROL AND ENHANCED LINEARITY OF SIGNAL

FIELD OF THE INVENTION

The present invention relates generally to a magnetoresistive field sensor, and more particularly to such a sensor based on extraordinary magnetoresistance (EMR).

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head is generally an inductive write element that includes an electrically conductive coil that generates a magnetic flux in a write pole. The read head includes a magnetoresitive sensor. In current read head designs a spin valve sensor, also referred to as a giant magnetoresistive (GMR) sensor, has been employed for sensing magnetic fields from the rotating magnetic disk. The sensor includes a nonmagnetic conductive layer, referred to as a spacer layer, sandwiched between first and second ferromagnetic layers, referred to as a pinned layer and a free layer. First and second leads are connected to the spin valve sensor for conducting a sense current therethrough. The magnetization of the pinned layer is generally oriented perpendicular to the air bearing surface (ABS) and the magnetic moment of the free layer is generally oriented parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The drive for ever increased data rate and data capacity has, however, lead researchers to search for new types of magnetoresistive sensors, capable of increased sensitivity at decreased track widths. One type of magnetoresistive sensor that has been proposed is what has been called an Extraordinary Magnetoresistive (EMR) Sensor. An advantage of EMR sensors is that the active region of the EMR sensor is constructed of non-magnetic semiconductor materials, and does not suffer from the problem of magnetic noise that exists in giant magnetoresistive sensors (GMR) and tunnel valves, both of which use magnetic films in their active regions.

The EMR sensor typically includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt. When an applied magnetic field is present, current is deflected from the shunt by the Lorentz force, and passes primarily through the semiconductor active region. The change in electrical resistance due to the applied magnetic field is detected across the voltage leads. EMR is described by T. Zhou et al., "Extraordinary magnetoresistance in externally shunted van der Pauw plates", Appl. Phys. Lett., Vol. 78, No. 5, 29 Jan. 2001, pp. 667-669.

One of the problems of EMR sensors, however, is that EMR sensors have a non-linear response in small magnetic fields, such as are found in magnetic storage applications. This is a disadvantage and has prevented their use in commercial recording systems. There is, therefore, a need for an EMR sensor design that can provide a well controlled, substantially linear response to magnetic fields, even when those fields are relatively small.

SUMMARY OF THE INVENTION

The present invention provides an EMR sensor having improved signal linearity at low magnetic fields. The EMR sensor includes an EMR active film that is electrically connected with a pair of voltage leads and also with a pair of current leads. An electrical shunt structure is connected with the active layer, and is constructed as a discontinuous structure.

The EMR sensor may include a heterostructure with a first side and a second side opposite the first side. The voltage leads and current leads can be connected with the first side, while the discontinuous shunt structure can be connected with the second side. The heterostructure can be constructed to include first second and third layers of semiconductor materials with the second layer being sandwiched between the first and third layer, the second layer having a band gap that is smaller than that of the first and third layers. The second layer can provide a two dimensional electron gas that functions as the EMR active film. Any of these layers may be composite layers.

The discontinuous shunt structure can be in the form of a plurality of discontinuous electrically conductive elements such as, for example, semi-spherical elements constructed of a material such as Au. The elements can be arranged so as to optimize the linearity of the sensor response, and can include, for example, 5 discrete shunt elements.

The novel discontinuous shunt structure advantageously improves the linearity of the signal response provided by the EMR sensor. This greatly increases the functionality of the EMR senor device.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
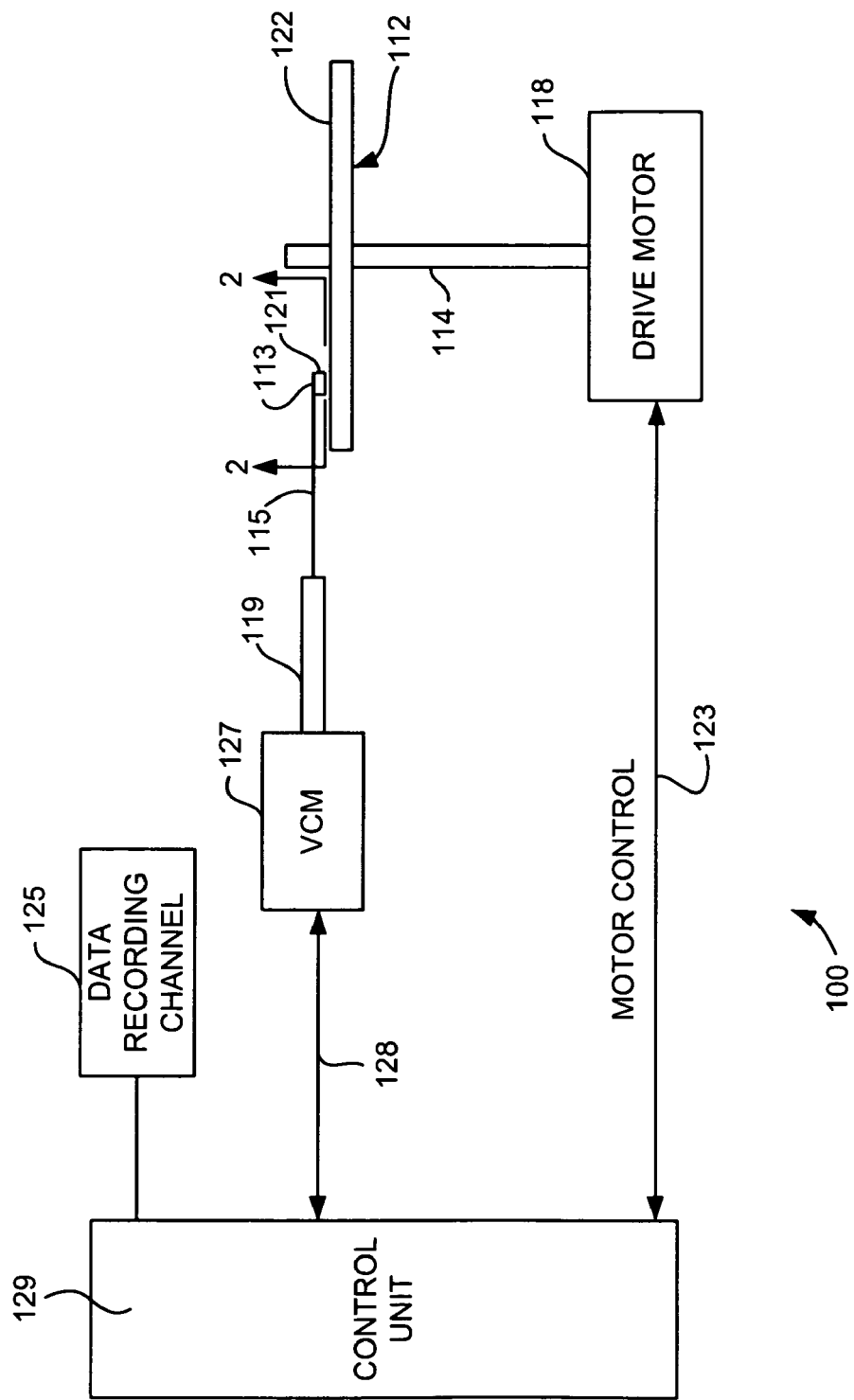
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
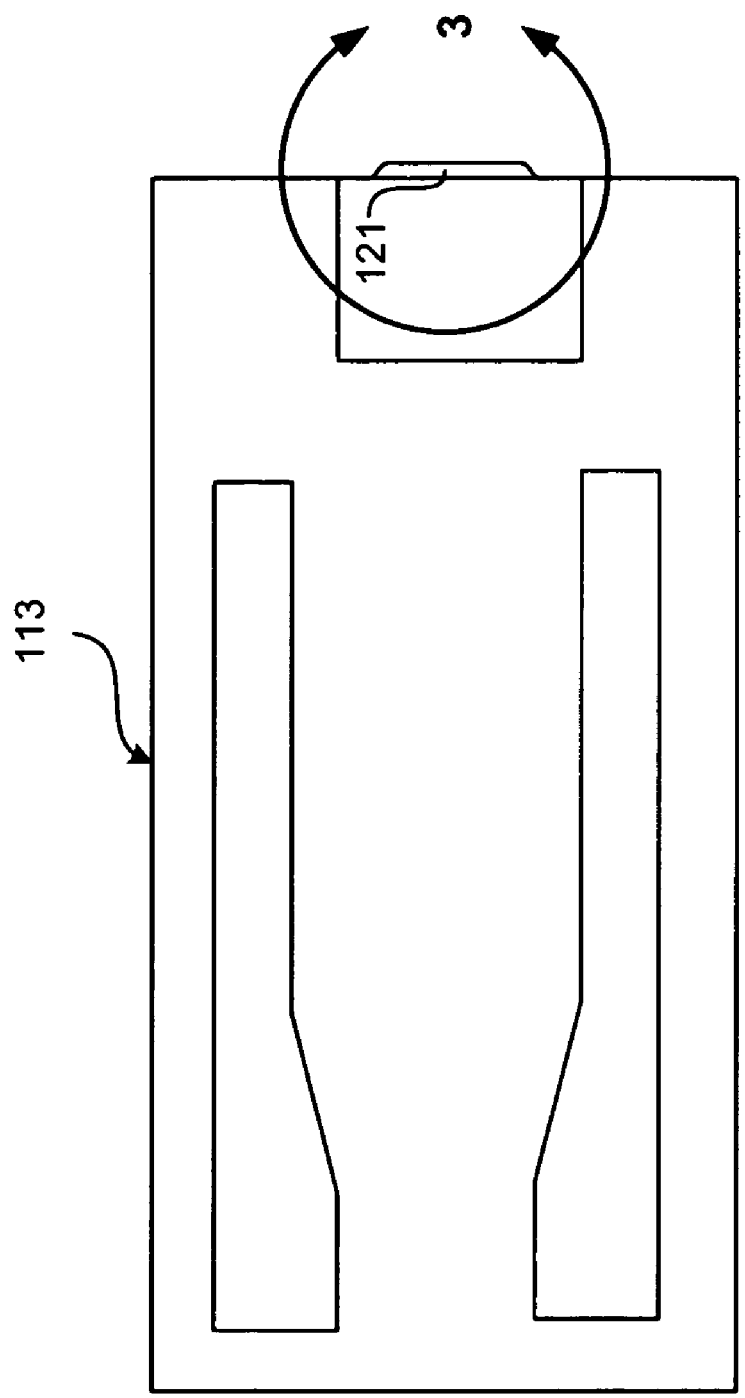
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
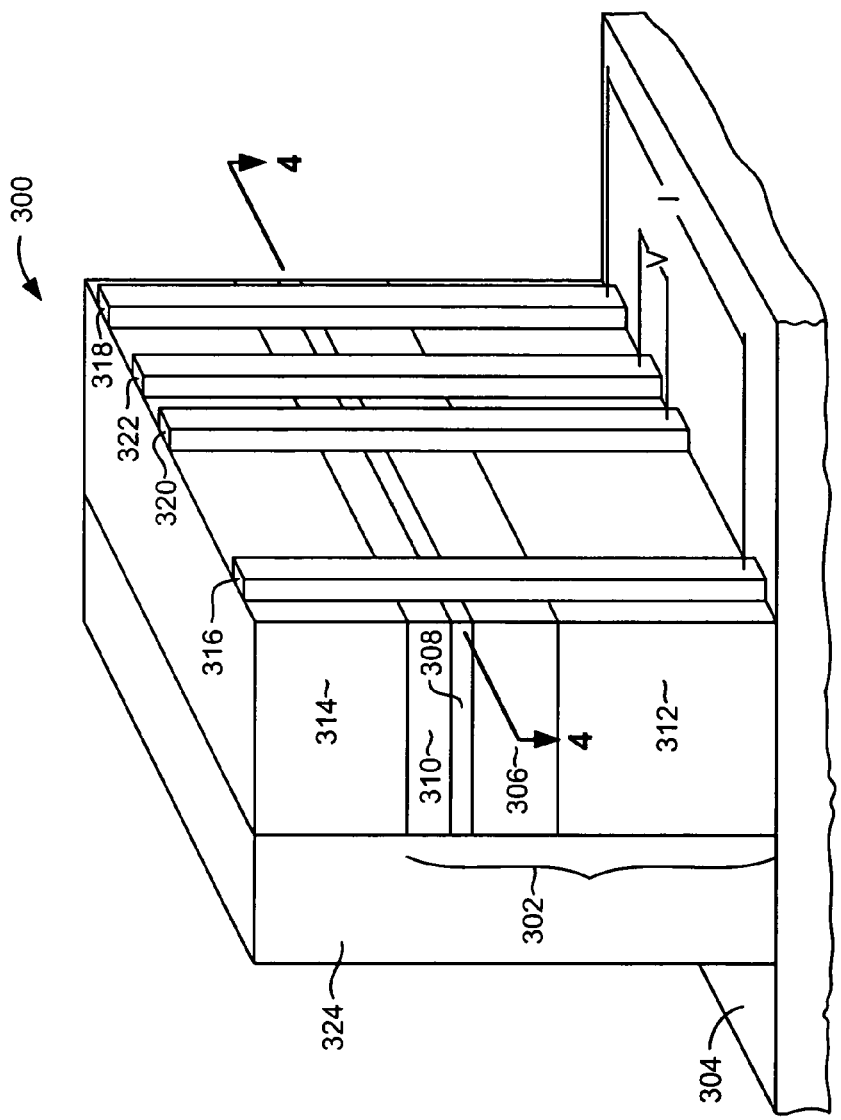
FIG. 3 is schematic isometric view of an EMR device according to the prior art.

With reference now to FIG. 3, a prior art extraordinary magnetoresistive sensor (EMR) 300 for use in a magnetic head 121 (FIG. 2) is shown. The EMR sensor 300 may include a structure 302 that is a III-V heterostructure formed on a semiconductor substrate 304 such as GaAs. However, the EMR sensor described in this invention is not restricted to III-V semiconductor materials. For example, it may also be formed on the basis of silicon or germanium. The heterostructure 302 includes a first layer 306 of semiconducting material having a first band-gap, a second layer 308 of semiconducting material formed on the first layer 306 and having a second bandgap that is smaller than that of the first layer 306, and a third semiconducting layer 310 of semiconducting material formed on top of the second layer 308 and having a third band gap that is greater than the second band gap. The materials in the first and third layers 306, 310 may be similar or identical. An energetic potential well (quantum well) is created by the first second and third semiconducting material layers due to the different band-gaps of the different materials. Thus carriers can be confined inside layer 308, which is considered the EMR active film in the sensor 300.

The first layer 306 is typically formed on top of a buffer layer 312 that may be one or more layers. The buffer layer 312 comprises several periods of a superlattice structure that function to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers may be incorporated into the semiconducting material in the first layer 306, the third layer 310, or both layers 306 and 310, and spaced apart from the boundary of the second and third semiconducting materials. The doped layers provide electrons (if n-doped) or holes (if p doped) to the quantum well. The electrons or holes are concentrated in the quantum well in the form of a two dimensional electron-gas or hole-gas, respectively.

The layers 306, 308, 310 may be for example a AlGaSb/InAs/AlGaSb or AlInSb/InSb/AlInSb heterostructure grown onto a semi-insulating GaAs substrate 304 with a buffer layer 312 in between. Both InAs and InSb are narrow band-gap semiconductors. Narrow band-gap semiconductors typically have a high electron mobility, since the effective electron mass is greatly reduced. Typical narrow band-gap materials are InSb and InAs. For example, the room temperature electron mobility of InSb and InAs are 70,000 cm$^2$/Vs and 35,000 cm$^2$/Vs, respectively.

The bottom AlGaSb or AlInSb layer 306 formed on the buffer layer 312 has a thickness in the range of approximately 1-3 microns and the top AlGaSb or AlInSb layer 310 has a thickness in the range of approximately 10 to 50 nm. The doping layers incorporated into layers 306, 310 have a thickness from one monolayer (delta-doped layer) up to 10 nm. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Si_3N_4$, $Al_2O_3$) or a non-corrosive semi-insulating semiconductor such as InAs.

Two current leads 316, 318 and two voltage leads 320, 322 are patterned on one side of the EMR structure 302 so that they make electrical contact with the quantum well.

A metallic shunt 324 is patterned on the side opposite the current and voltage leads of the EMR structure 302 so that it makes electrical contact with the quantum well. The applied magnetic field H, i.e., the magnetic field to be sensed, is shown by the arrows and is normal to the plane of the films in the EMR structure 302. The leads 316, 318, 322 typically comprise metallic contacts, for example Au, AuGe, or Ge, which may be diffused into the device. The leads are typically formed after formation of the capping layer 314, and sometimes after removal of some of the capping layer material.

Figure 4:
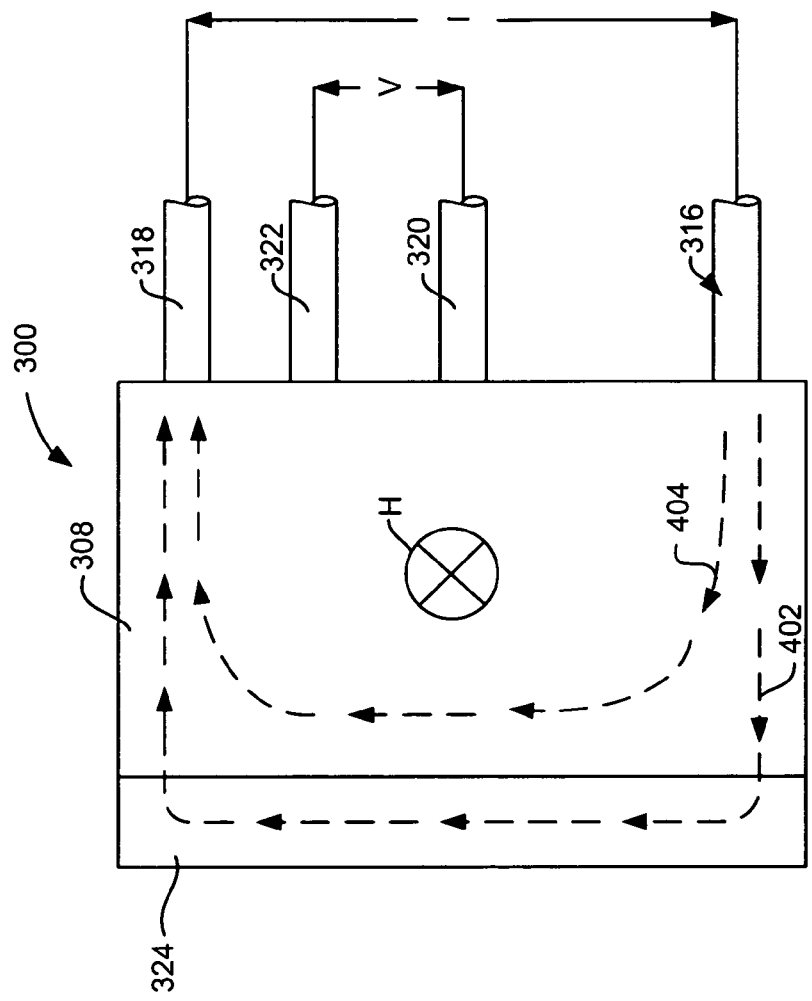
FIG. 4 is a view taken from line 4-4 of FIG. 3.

FIG. 4 is a top schematic view of the EMR sensor 300 through a section of the active film 308 and will illustrate the basic operation of the sensor. In the absence of an applied magnetic field H, sense current through the leads 316, 318 passes into the semiconductor active film 308 and is shunted through the shunt 324, as shown by line 402. When an applied magnetic field H is present, as shown by the arrow tail into the paper in FIG. 2, current is deflected from the shunt 324 and passes primarily through the semiconductor active film 308, as shown by line 404. The change in electrical resistance due to the applied magnetic field is detected across the voltage leads 320, 322.

THE INVENTION

Figure 5:
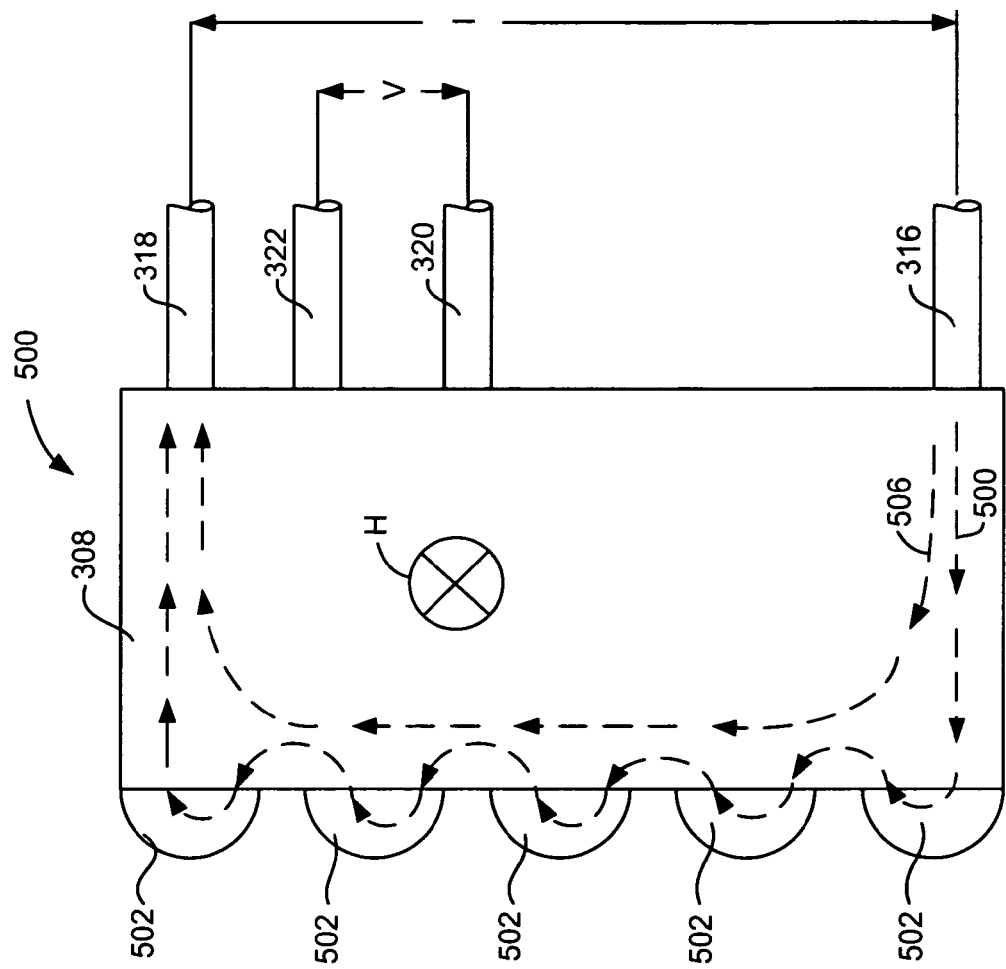
FIG. 5 is a cross sectional view of an EMR device according to an embodiment of the present invention.

With reference now to FIG. 5 an EMR sensor 500 according to an embodiment of the invention is shown. FIG. 5 is similar to FIG. 4 in that it is a top schematic view of the EMR sensor 500 taken through a section of the active film 308. As can be seen in FIG. 5, an EMR sensor 500 according to the present invention has a shunt structure that is constructed as a series of discontinuous discrete shunt portions 502. The number and arrangement of these discrete shunt portions 502 can vary depending upon design considerations. The shunt elements 502 are preferably constructed of a highly electrically conductive material such as Au, and as mentioned above can be arranged in such as manner as to linearize the low field response so that it can easily be used as the input to a signal amplifier.

As shown in FIG. 5, the shunt structure is constructed as a series of semi-spherical elements 502. It should be understood, however, that the shunt portions 502 could be constructed in other shapes, such as but not limited to square or rectangular prisms, cylinders, etc.

The novel, discontinuous shunt structure serves to smooth the low field response curve of the EMR device. Furthermore, appropriate placement of the metal contacts allows control of the low field response (output voltage) of the device which may be useful for integrating the EMR device 500 with a suitable amplifier in a read sensor assembly. As can be seen in FIG. 5, the sense current 504 in the absence of an applied magnetic field H shunts through the shunt elements 502 where such elements 502 are available and travels through the active layer 308 when passing between shunt elements. The sense current 506 travels through the active layer 308, rather than through the shunt structures 502 when a magnetic field H is applied, as indicated by line 506.

The shunt elements 502 can be formed, for example by conventional semiconductor wafer batch processing techniques to construct both the semiconductor mesa and the metal leads and shunts. Alternatively, colloidal gold spheres in conjunction with organic linkers could be used to form the array of metal shunts along the semiconductor mesa edge.

Figure 6:
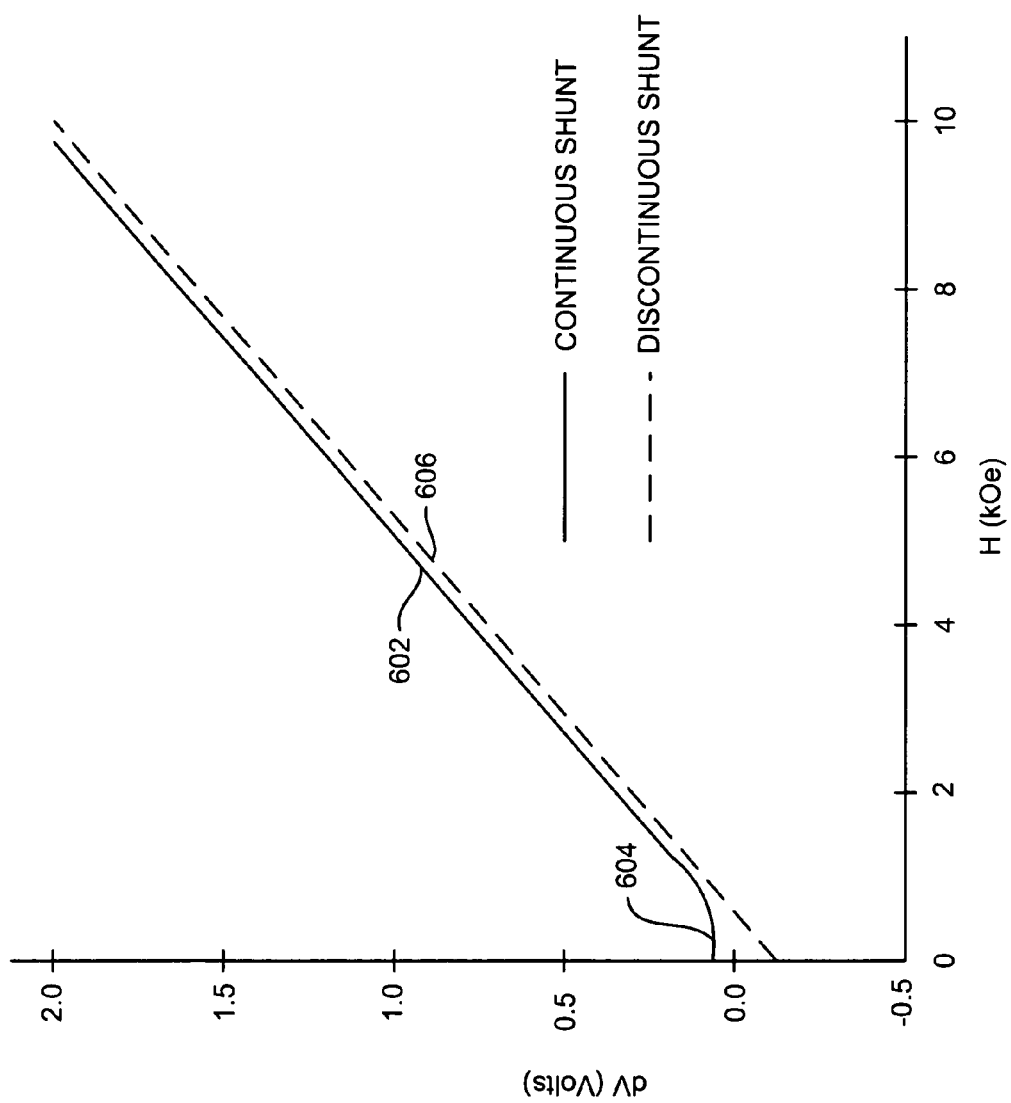
FIG. 6 is a graph illustrating the relationship between voltage change (dV) with respect to applied magnetic field (H) for both a prior art EMR device and an EMR device according to the present invention, illustrating the improvement in linearity provided by the present invention.

FIG. 6 shows a comparison of dV as a function of field for a prior art EMR sensor compared with a sensor according to the present invention having a discontinuous shunt structure. With reference to FIG. 6 it can be seen that the prior art sensor has a non-linear response at low magnetic fields, whereas the sensor according to the invention has a linear response with respect to magnetic field everywhere. The response dV for a prior art EMR sensor is indicated by line 602, and as can be seen, the response becomes non-linear in a region 604 where the applied magnetic field is low. By contrast, the response dV of an EMR sensor according to the present invention is indicated by line 606, and is linear along the entire range of magnetic field, even where the field reaches 0 kOe.

Tests and modeling were performed in order to explore manufacturable means for forming a shunt structure onto an EMR device. When the discontinuous shunt structure was used it was found that not only was the performance as good as the prior art continuous structure, the performance (such as linearity of response) was actually improved over the prior art continuous shunt structure.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. An extraordinary magnetoresistive sensor (EMR), comprising:
   a semiconductor substrate;
   an EMR active film on the substrate, the active film comprising a nonmagnetic semiconductor material responsive to a magnetic field generally perpendicular to the active film;
   a discontinuous electrically conductive shunt structure in contact with the active film;
   a pair of voltage leads electrically connected with the active film; and
   a pair of current leads electrically connected with the active film.

2. An EMR sensor as in claim 1 wherein the discontinuous shunt structure comprises a plurality of discrete electrically conductive shunt elements.

3. An EMR sensor as in claim 1 wherein the discontinuous shunt structure comprises a plurality of semi-spherical, electrically conductive shunt elements.

4. An EMR sensor as in claim 1 wherein the discontinuous shunt structure comprises a plurality of electrically conductive shunt elements comprising one or more of Au, Ag, Pd, Pt, and Ta.

5. A EMR sensor as in claim 1 wherein the discontinuous shunt structure comprises a plurality of electrically conductive shunt elements arranged to optimize a linearity of response for the EMR sensor.

6. An EMR sensor as in claim 1 wherein the semiconductor substrate is comprised of GaAs or Si.

7. An extraordinary magnetoresistive sensor (EMR), comprising:
- a heterostructure including a two dimensional electron gas, the hetrostructure having a first side and a second side opposite the first side;
- a pair of voltage leads electrically connected with the first side of the heterostructure;
- a pair of current leads electrically connected with the first side of the heterostructure; and
- a discontinuous electrically conductive shunt structure connected with the second side of the heterostructure.

8. An EMR sensor as in claim 7 wherein the discontinuous shunt structure comprises a plurality of discrete electrically conductive shunt elements.

9. An EMR sensor as in claim 7 wherein the discontinuous shunt structure comprises a plurality of electrically conducting shunt elements comprising Au.

10. An EMR sensor as in claim 7 wherein the discontinuous shunt structure comprises a plurality of semispherical, electrically conductive elements.

11. An EMR sensor as in claim 7 wherein the discontinuous shunt structure comprises a plurality of semipherical elements comprising Au.

12. An EMR sensor as in claim 7 wherein the discontinuous shunt structure comprises a plurality of discrete, electrically conductive elements arranged to optimize a linearity of response for the sensor.

13. An EMR sensor as in claim 7 wherein the heterostructure comprises of layers from III-V semiconductors.

14. An EMR sensor as in claim 7 wherein the heterostructure comprises a layer of InAs, or InSb, or an alloy comprising InAs or InSb.

15. An EMR sensor as in claim 7 wherein the hetrostructure further comprises:
- a first semiconductor layer;
- a second semiconductor layer; and
- a third semiconductor layer;
- wherein the second semiconductor layer is sandwiched between the first and third semiconductor layers and provides the two dimensional electron gas.

16. An EMR sensor as in claim 7 wherein the hetrostructure further comprises:
- a first semiconductor layer having a first band gap;
- a second semiconductor layer having a second band gap; and
- a third semiconductor layer having a third band gap;
- wherein the second semiconductor layer is sandwiched between the first and third semiconductor layers and wherein the second band gap is smaller than the first and third band gaps.

17. An EMR sensor as in claim 7 wherein the hetrostructure further comprises:
- a first semiconductor layer;
- a second semiconductor layer; and
- a third semiconductor layer,
- wherein:
- the second semiconductor layer is sandwiched between the first and third semiconductor layers;
- the first and third semiconductor layers are constructed of the same material;
- the second semiconductor layer is constructed of a material that has a bandgap that is smaller than that of the first and third semiconductor layers.

18. A magnetic data storage device, comprising:
- a magnetic media;
- an actuator;
- a slider connected with the slider for movement across a surface of the magnetic media;
- an extraordinary magnetoresistive (EMR) sensor connected with the slider for reading a magnetic signal from the magnetic media, the EMR sensor further comprising:
  - a semiconductor substrate;
  - an EMR active film on the substrate, the active film comprising a nonmagnetic semiconductor material responsive to a magnetic field generally perpendicular to the active film;
  - a discontinuous electrically conductive shunt structure in contact with the active film;
  - a pair of voltage leads electrically connected with the active film; and
  - a pair of current leads electrically connected with the active film.

19. A magnetic data storage device, comprising:
- a magnetic media;
- an actuator;
- a slider connected with the slider for movement across a surface of the magnetic media;
- an extraordinary magnetoresistive (EMR) sensor connected with the slider for reading a magnetic signal from the magnetic media, the EMR sensor further comprising:
- an extraordinary magnetoresistive sensor (EMR), comprising:
  - a heterostructure including a two dimensional electron gas, the heterostructure having a first side and a second side opposite the first side;
  - a pair of voltage leads electrically connected with the first side of the heterostructure;
  - a pair of current leads electrically connected with the first side of the heterostructure; and
  - a discontinuous electrically conductive shunt structure connected with the second side of the heterostructure.

* * * * *